United States Patent
Li

(10) Patent No.: US 10,522,610 B2
(45) Date of Patent: Dec. 31, 2019

(54) DISPLAY DEVICE WITH HEMISPHERICAL PARTICLES ON CHIP-ON-FILM SURFACE, AND MANUFACTURING METHOD THEREOF

(71) Applicant: Huizhou China Star Optoelectronics Technology Co., Ltd., Huizhou, Guangdong (CN)

(72) Inventor: Quan Li, Guangdong (CN)

(73) Assignee: Huizhou China Star Optoelectronics Technology Co., Ltd., Huizhou (CN)

( * ) Notice: Subject to any disclaimer, the term of this patent is extended or adjusted under 35 U.S.C. 154(b) by 0 days.

(21) Appl. No.: 16/108,735

(22) Filed: Aug. 22, 2018

(65) Prior Publication Data

US 2019/0305068 A1    Oct. 3, 2019

Related U.S. Application Data

(63) Continuation of application No. PCT/CN2018/083309, filed on Apr. 17, 2018.

(30) Foreign Application Priority Data

Apr. 3, 2018  (CN) .......................... 2018 1 0290153

(51) Int. Cl.
  *H01L 27/32*  (2006.01)
  *H01L 51/52*  (2006.01)
  *H01L 51/56*  (2006.01)

(52) U.S. Cl.
  CPC ........ *H01L 27/3276* (2013.01); *H01L 51/524* (2013.01); *H01L 51/56* (2013.01)

(58) Field of Classification Search
  CPC ... H01L 27/3276; H01L 51/56; H01L 51/524; H01L 27/124
  See application file for complete search history.

(56) References Cited

U.S. PATENT DOCUMENTS

| | | | | |
|---|---|---|---|---|
| 6,107,679 A | * | 8/2000 | Noguchi | H01L 23/13 257/678 |
| 2009/0268299 A1 | * | 10/2009 | Furui | G02B 5/0226 359/601 |
| 2013/0207093 A1 | * | 8/2013 | Jeong | H01L 51/5243 257/40 |

FOREIGN PATENT DOCUMENTS

| | | |
|---|---|---|
| CN | 103728747 A | 4/2014 |
| CN | 104728681 A | 6/2015 |
| CN | 106449713 A | 2/2017 |
| CN | 107833907 A | 3/2018 |
| JP | 2014224939 A | 12/2014 |

* cited by examiner

*Primary Examiner* — Quoc D Hoang

(57) ABSTRACT

The present disclosure discloses a display device and a manufacturing method thereof. The display device is provided with a chip-on-film package and a sealant in a wiring area of the display device, with first surface of the chip-on-film package connected to the active area of the display device to provide a driving signal to the active area, and the second surface of the chip-on-film package provided with a concave-convex structure, a sealant covering the concave-convex structure of the chip-on-film package.

12 Claims, 6 Drawing Sheets

US 10,522,610 B2

DISPLAY DEVICE WITH HEMISPHERICAL PARTICLES ON CHIP-ON-FILM SURFACE, AND MANUFACTURING METHOD THEREOF

CROSS-REFERENCE TO RELATED APPLICATIONS

The present application is a continuation-application of International (PCT) Patent Application No. PCT/CN2018/083309, field on Apr. 17, 2018, which claims foreign priority of Chinese Patent Application No. 201810290153.2, filed on Apr. 3, 2018 in the State Intellectual Property Office of China, the entire contents of which are hereby incorporated by reference.

TECHNICAL FIELD

The present disclosure relates to a field of display technologies, and in particular, to a display device and a manufacturing method of the display device.

BACKGROUND

At present, a design of narrow bezel and a bezel-less design have become a trend of display devices, in which case, as the thickness of the bezel is reduced, users may obtain a broader view when viewing the display screen, and those designs may provide a larger view to users, when the size is the same. Meanwhile, as the bezel is removed, the display device appears to be a unity, without any trace of stitching, thus achieving a more elegant appearance.

The display device is provided with a wiring area on at least one side of itself, and the display device links to a driving signal through the wiring area. Taking a display device including a design of chip-on-film package (COF) as an example, the COF located in the wiring area is connected to a source driving side of the display device. However, as shown in FIG. 1 to FIG. 3, the surface of the COF 11 is relatively smooth. When a sealant 13 is filled in the wiring area 12 (that is, in the sealing process), the contacting position between the COF 11 and the sealant 13 is easily peeled for an insufficient adhesion, that is, the COF 11 may be detached from the display panel 14, thereby affecting the production yield.

SUMMARY

In light of the above problem, the present disclosure provides a display device and a manufacturing method thereof, to improve the adhesion between a COF and a sealant and avoid the peeling of COF.

A display device according to an embodiment of the present disclosure includes an active area and a wiring area. In the display device, the wiring area is provided with a COF and a sealant, with one side of the COF is connected to the active area to provide a driving signal to the active area, and the other side of the COF is provided a concave-convex structure, and the sealant is made of a light shielding material and covering the concave-convex structure of the COF.

In an embodiment of the disclosure, a manufacturing method of the display device, providing a display panel includes an active area and a wiring area. the wiring area is provided with a COF and a sealant, with one side of the COF connected to the active area to provide a driving signal to the active area, and the other side of the COF provided with a concave-convex structure, and the sealant covers the concave-convex structure of the COF.

A manufacturing method of a display device according to an embodiment of the present disclosure includes following steps.

The method includes a step of providing a display panel, the display panel including an active area and a wiring area.

The method includes a step of disposing a COF on the wiring area, with one side of the COF connected with the active area to provide a driving signal to the active area, and the other side of the COF provided with a concave-convex structure;

The method further includes a step of covering a sealant on the concave-convex structure of the COF.

The beneficial effects lies in that, in this disclosure, by providing a concave-convex structure on one side of the COF contacting with the sealant, the roughness of the COF on the side is improved, so that the adhesion between the COF and the sealant can be improved, thereby avoiding the peeling of COF.

DETAILED DESCRIPTION

A main purpose of the present disclosure is to provide a display device including a COF, with a concave-convex structure on one side of the COF to increase the roughness of the COF on the side, so as to improve the adhesion between the COF and the sealant and avoid the peeling of COF, further to improve the production yield.

Figure 1:
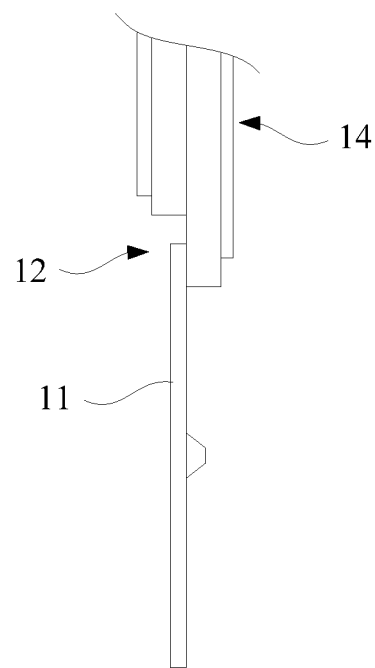
FIG. 1 is a schematic diagram of a connection between a COF and a display panel according to an embodiment in the related art.
Figure 2:
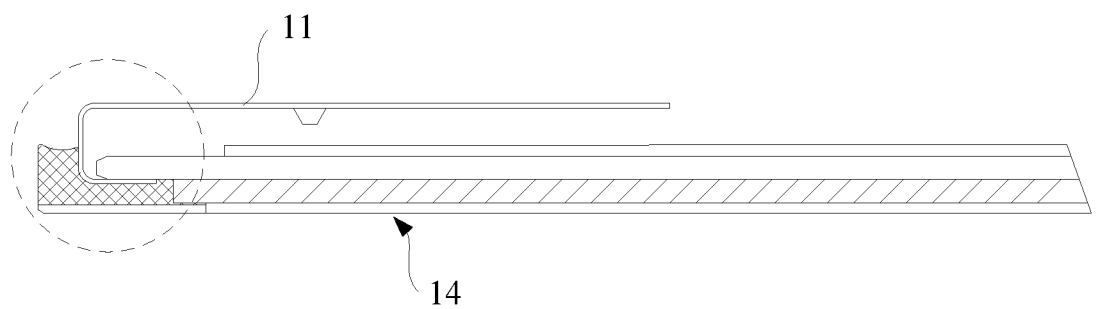
FIG. 2 is a schematic diagram of a structure of a wiring area filled with a sealant shown in FIG. 1.
Figure 3:
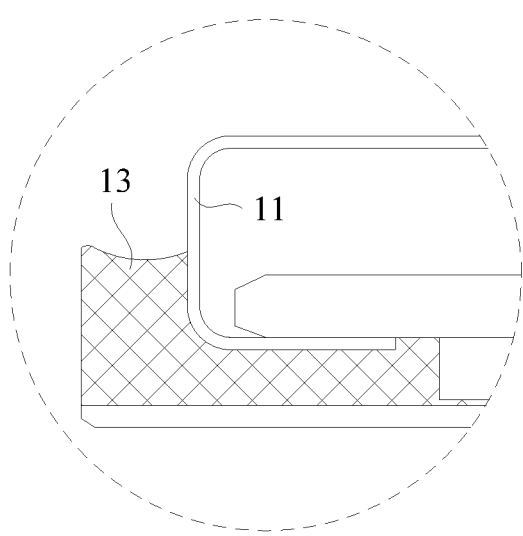
FIG. 3 is a partially enlarged schematic diagram of the wiring area shown in FIG. 2.
Figure 4:
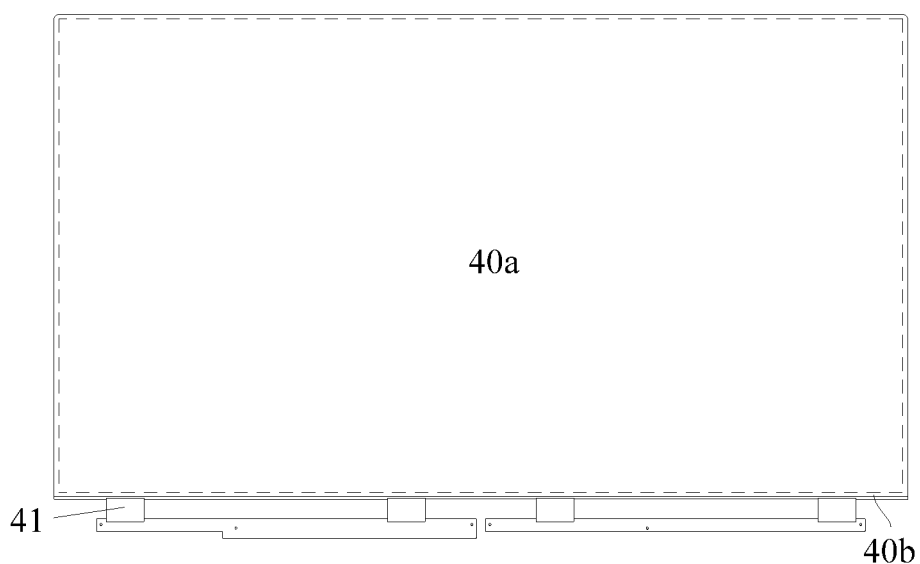
FIG. 4 is a top view of a structure of a display device according to an embodiment of the present disclosure.

The present disclosure can be applied to a display device having a narrow bezel as well as a bezel-less design. FIG. 4 is a top view of a structure of a display device according to an embodiment of the present disclosure. Referring to FIG. 4, the display device 40 includes an active area (AA) 40*a* and a wiring area 40*b* on a source driving side of the active area 40*a*. The wiring area 40*b* is provided with a conductive element. The conductive element is configured to connect to a flexible circuit board assembly (FCBA) 41 so that a driving signal is input to the active area 40a to realize screen displaying.

The display device 40 includes but is not limited to a liquid crystal display (LCD), and an organic light-Emitting diode (OLED) displayer. The technical solutions of various exemplary embodiments provided in the present disclosure will be clearly and completely described as follows with reference to the accompanying drawings in the embodiments of the present disclosure. In the following embodiments, the non-conflicting ones may be combined with each other.

Figure 5:
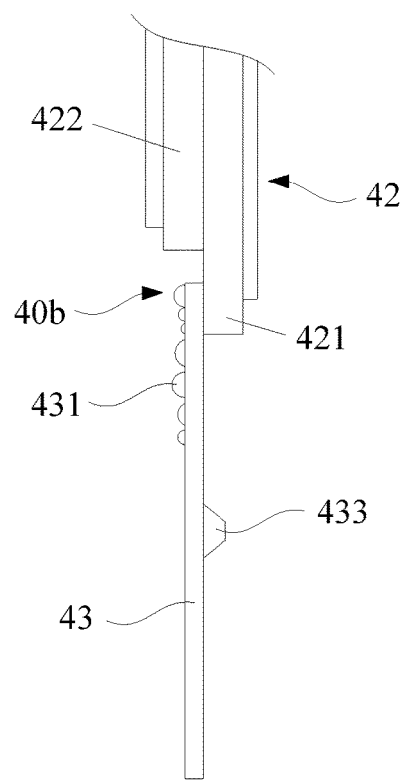
FIG. 5 is a schematic diagram of a connection between a COF and a display panel in a wiring area in a first embodiment of the present disclosure.
Figure 6:
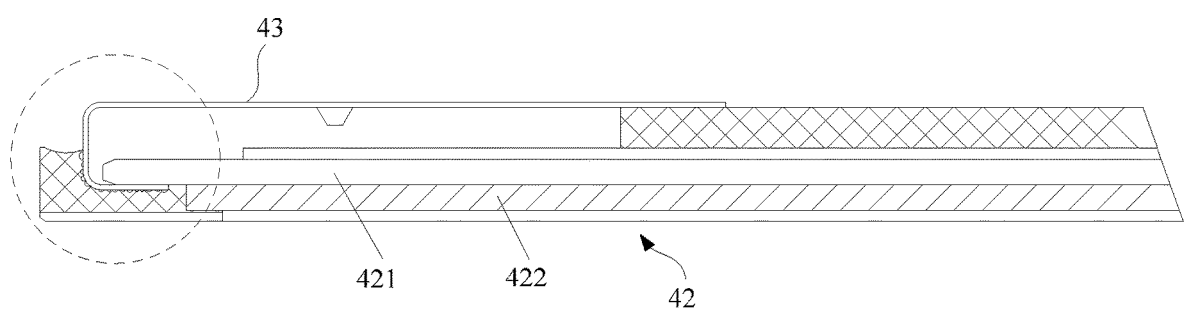
FIG. 6 is a schematic structural diagram of the wiring area filled with a sealant shown in FIG. 5.
Figure 7:
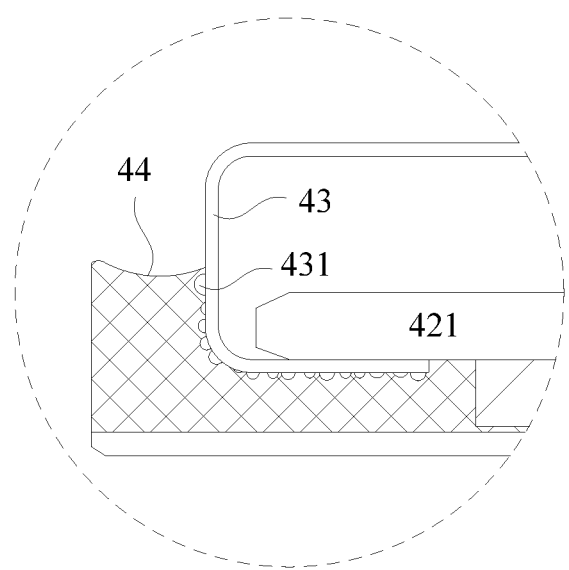
FIG. 7 is a partially enlarged schematic diagram of the wiring area shown in FIG. 6.

FIG. 5 is a schematic diagram of the connection between the COF and the display panel in the wiring area in the first embodiment of the present disclosure. Referring to FIG. 5 to FIG. 7, the display device 40 may further include a display panel 42, a COF 43, and a sealant 44. The COF 43 may be connected to the flexible circuit board assembly 41 and configured to provide the display panel 42 with a driving signal. The sealant 44 may be configured to realize a sealing process.

The display panel 42 may include a first substrate 421 and a second substrate 422. Of course, in the application scenario where the display device 40 is an LCD, the display panel 42 may further include liquid crystal filled between the first substrate 421 and the second substrate 422. The liquid crystal is located in a liquid crystal cell formed by stacking the first substrate 421 and the second substrate 422, and correspondingly, one of the first substrate 421 and the second substrate 422 is an array substrate or a thin film transistor substrate, i.e., TFT substrate, and the other is a color film substrate or a color filter substrate, i.e., CF substrate.

In this embodiment, the first substrate 421 and the second substrate 422 may be provided with different area sizes, and the one with a larger area defines the wiring area 40b. As shown in FIG. 4 to FIG. 6, taking the case that the area size of the first substrate 421 is larger than that of the second substrate 422 as an example, the first substrate 421 includes an active area 40a and a wiring area 40b, and the second substrate 422 has an orthographic projection on the substrate 421 overlapping with the active area 40a. In this case, the wiring area 40b is provided with a conductive terminal, and the terminal is connected with the PCBA 41 through the COF 43 so as to link to the driving signal to control the deflection of the liquid crystal to display views. The sealant 44 may be filled in the wiring area 40b and contacts with a portion of the COF 43. In an embodiment of the present disclosure, the sealant 44 may be made of a light-shielding material to avoid light leakage in the wiring area 40b of the display device 40.

Figure 8:
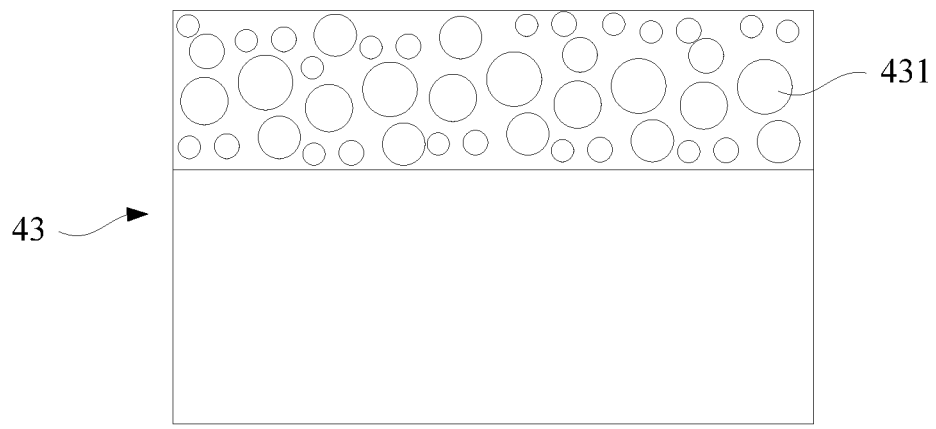
FIG. 8 is a top view of a COF of the display device shown in FIG. 5.

Different from the related art, the COF 43 of the present embodiment has particles 431 distributed on one side of the COF 43, as shown in FIG. 8. Specifically, one side (inner side) of the COF 43 is connected to the active area 40a for providing the display panel 42 with the driving signal, while particles 431 are distributed on the other side (outer side) of the COF 43, and the particle sizes of these particles 431 may be the same or different. It should be understood that, as shown in FIG. 7, the particles 431 are not distributed all over the entire outer side of the COF 43, but only distributed over a portion of the outer side of the COF 43, which is a region where the COF 43 contacting with the sealant 44. Herein, the particles 431 can be regarded as a concave-convex structure provided on the outer side the COF 43. Therefore, the roughness of the outer side of the COF 43 on the side is improved, and thus the adhesion between the COF 43 and the sealant 44 can be improved, thereby avoiding the peeling of the COF 43.

In a practical application scenario, the concave-convex structure of the COF 43 may be formed by way of coating particles. Taking the case that the particles 431 are resin particles as an example, before the COF 43 is connected to the active area 40a, a non-solid resin is coated on a region of the outer side of the COF 43 to be contacted with the sealant 44, and then the non-solid resin is irradiated with light (for example, ultraviolet light) to get cured to form the concave-convex structure.

Figure 9:
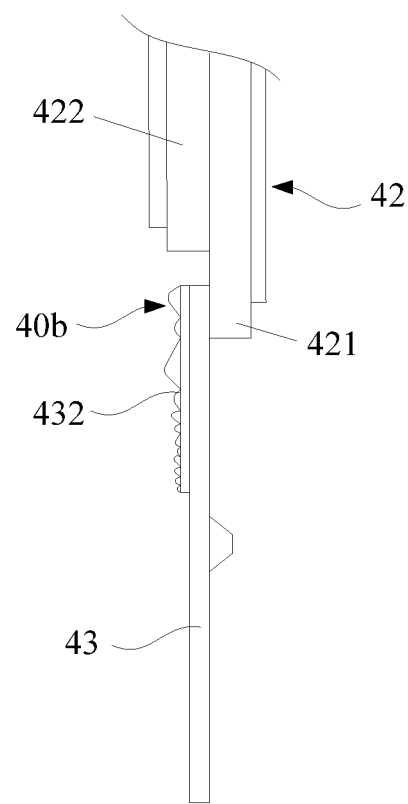
FIG. 9 is a schematic diagram of a connection between a COF and a display panel in a wiring area according to a second embodiment of the present disclosure.
Figure 10:
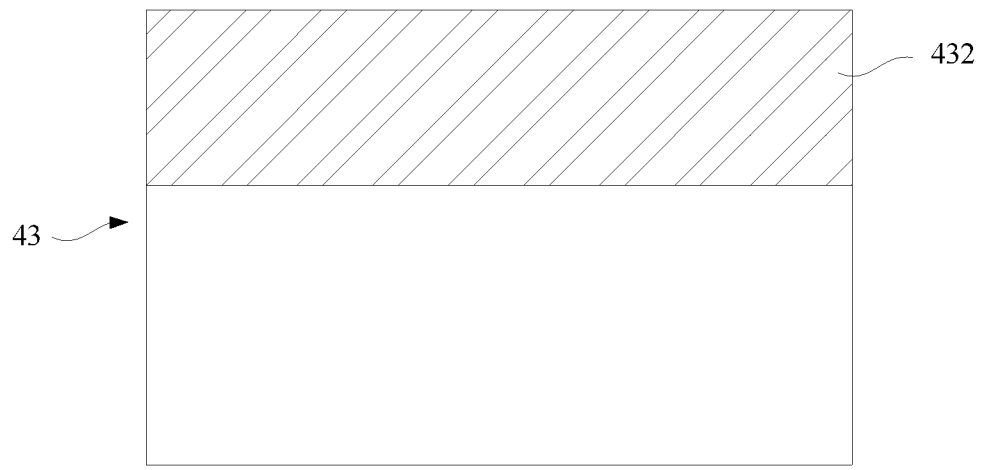
FIG. 10 is a top view of the structure of the COF of the display device shown in FIG. 9.

FIG. 9 is a schematic diagram of the connection between the COF and the display panel in the wiring area in a second embodiment of the present disclosure, and FIG. 10 is a top view of the structure of the COF in the display device shown in FIG. 9. To facilitate description, the elements with the same structure are identified by reference numerals the same with those in the above embodiment. Referring to FIG. 4, FIG. 9 and FIG. 10, based on the description of the foregoing embodiment, but different from the foregoing embodiment, the outer side of the COF 43 of this embodiment is attached with a film 432, and the film 432 has a concave-convex outer surface. It should be understood that, as shown in FIG. 10, the film 432 is not attached to the entire outer side of the COF 43, but is only distributed in a portion of the area outside the COF 43, which is an area where the COF 43 contacting with the sealant 44. The film 432 (or the outer surface of the film 432) can be regarded as the concave-convex structure provided on the outer side the COF 43. Therefore, the roughness of the outer side of the COF 43 is improved, thus the adhesion between the COF 43 and the sealant 44 can be improved, thereby avoiding the peeling of the COF 43.

In a practical application scenario, the film 432 may be an adhesive tape. Before the COF 43 is connected to the active area 40a, the adhesive tape is adhered to a region on the outer side of the COF 43 to be contacted with the sealant 44. An inner surface of the adhesive tape is adhesive to the outer side of the COF 43, so as to form the concave-convex structure.

It should be understood that the display device 40 of the above embodiments of the present disclosure further includes other components. For example, the display device 40 may further include a side frame abutting against an outer edge of the sealant 44. For another example, in an application scenario that the display device 40 is an LCD, the display device 40 may further include a backlight module. For another example, a drive IC 433 may be further disposed on the inner side of the COF 43. The design of these components may refer to the prior art.

Figure 11:
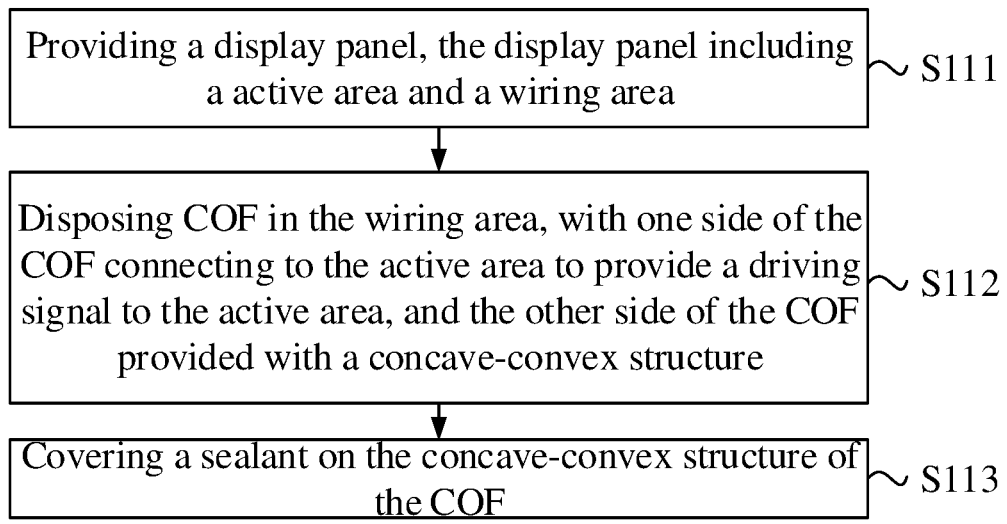
FIG. 11 is a schematic flowchart of a manufacturing method of a display device according to an embodiment of the present disclosure.

FIG. 11 is a schematic flowchart of a manufacturing method of a display device according to an embodiment of the present disclosure. As shown in FIG. 11, the manufacturing method of the display device may include blocks S111-S113.

In S111, a display panel is provided, the display panel may include an active area and a wiring area.

In S112, a COF is applied in the wiring area, with one side of the COF connected to the active area for providing a driving signal to the active area, and the other side of the COF provided with a concave-convex structure.

In S113, the manufacturing method may include covering a sealant on the concave-convex structure of the COF.

The manufacturing method can be used to manufacture the display device 40 of the above embodiment. Based on this, details are as follows.

In block S112, the concave-convex structure of the COF can be formed by way of coating particles. Taking the case that the particles are resin particles as an example, before the COF is connected to the active area, a non-solid resin is coated on a region of the other side of the COF to be contacted with the sealant 44, and then the non-solid resin is irradiated with light (for example, ultraviolet light) to get cured so as to form the concave-convex structure.

Definitely, in the present embodiment, the concave-convex structure of the COF can also be formed by being attached with a film. For example, before the COF is connected to the active area, a film with a concave-convex outer surface is attached to a region on the other side of the COF to be contacted with the sealant.

Since the manufacturing method of this embodiment can be used to manufacture a display device having the same structure as the above-described display device 40, it has beneficial effects the same with the above-described display device 40.

It should be understood that the above description merely illustrates some exemplary embodiments of the disclosure, which however are not intended to limit the scope of the disclosure to these specific embodiments. Any equivalent structural or flow modifications or transformations made to the disclosure, or any direct or indirect disclosures of the disclosure on any other related fields, shall all fall in the scope of the disclosure.

What is claimed is:

1. A display device having an active area and a wiring area, the display device comprising:
   a chip-on-film having a first surface and a second surface opposite to the first surface, wherein the first surface is connected to the active area and configured to provide a driving signal to the active area, a plurality of particles are provided on the second surface; and
   a sealant covering and being in contact with the particles;
   wherein the particles are hemispherical and configured to improve an adhesion between the chip-on-film and the sealant.

2. The display device of claim 1, wherein the sealant is made of a light-shielding material, and the particles comprise resin particles.

3. The display device of claim 2, wherein a material of the resin particles is a photocurable resin.

4. The display device of claim 1, wherein the display device is an OLED displayer, and the wiring area is provided with the chip-on-film and the sealant.

5. A display device having an active area and a wiring area, the display device comprising:
   a chip-on-film having a first surface and a second surface opposite to the first surface, wherein the first surface is connected to the active area and configured to provide a driving signal to the active area;
   a concave-convex structure is provided on the second surface of the chip-on-film; and
   a sealant covering and being in contact with the concave-convex structure;
   wherein particles are distributed on the second surface of the chip-on-film, and the concave-convex structure is formed by these particles, the particles are hemispherical and configured to improve an adhesion between the chip-on-film and the sealant.

6. The display device of claim 5, wherein the particles comprise resin particles.

7. The display device of claim 6, wherein a material of the resin particles is a photocurable resin.

8. The display device of claim 5, wherein the particles have different particle sizes.

9. The display device of claim 5, wherein the display device is an OLED displayer, and the wiring area is provided with the chip-on-film package and the sealant.

10. A method of manufacturing a display device, comprising:
    providing a display panel, the display panel comprising an active area and a wiring area;
    disposing a chip-on-film package on the wiring area, wherein the chip-on-film package has a first surface connected with the active area to provide a driving signal to the active area and a second surface opposite to the first surface;
    providing a concave-convex structure on a second surface of the chip-on-film package; and
    providing a sealant and covering the sealant on the concave-convex structure;
    wherein particles are distributed on the second surface of the chip-on-film package, and the concave-convex structure is formed by these particles, the particles are hemispherical and configured to improve an adhesion between the chip-on-film package and the sealant;
    wherein the particles comprise resin particles, the providing the concave-convex structure comprising:
    coating a non-solid resin on the other side of the chip-on-film package, and curing the non-solid resin to from the hemispherical particles.

11. The method of claim 10, wherein the non-solid resin is cured with ultraviolet light.

12. The display device of claim 10, wherein the particles are provided with different particle sizes.

* * * * *